(12) United States Patent
Dangelo et al.

(10) Patent No.: US 7,656,027 B2
(45) Date of Patent: Feb. 2, 2010

(54) IN-CHIP STRUCTURES AND METHODS FOR REMOVING HEAT FROM INTEGRATED CIRCUITS

(75) Inventors: Carlos Dangelo, Los Gatos, CA (US); Bala Padmakumar, Mountain View, CA (US)

(73) Assignee: Nanoconduction, Inc., Menlo Park, CA (US)

( * ) Notice: Subject to any disclaimer, the term of this patent is extended or adjusted under 35 U.S.C. 154(b) by 95 days.

(21) Appl. No.: 11/443,669

(22) Filed: May 30, 2006

(65) Prior Publication Data
US 2006/0278901 A1   Dec. 14, 2006

Related U.S. Application Data

(63) Continuation-in-part of application No. 10/762,666, filed on Jan. 22, 2004, now abandoned.

(60) Provisional application No. 60/687,289, filed on Jun. 2, 2005, provisional application No. 60/442,450, filed on Jan. 24, 2003.

(51) Int. Cl.
*H01L 23/34* (2006.01)

(52) U.S. Cl. .............. 257/713; 257/276; 257/E21.407; 174/250; 361/780; 438/122

(58) Field of Classification Search ............ 257/276, 257/713, E21.407; 361/780; 174/250
See application file for complete search history.

(56) References Cited

U.S. PATENT DOCUMENTS

| | | | |
|---|---|---|---|
| 5,621,616 A | 4/1997 | Owens et al. | |
| 5,818,700 A | 10/1998 | Purinton | |
| 5,837,081 A | 11/1998 | Ting et al. | |
| 5,926,370 A | 7/1999 | Cromwell | |
| 5,955,781 A | 9/1999 | Joshi et al. | |
| 5,965,267 A | 10/1999 | Nolan et al. | |

(Continued)

FOREIGN PATENT DOCUMENTS

EP   1329953 A1   8/2003

(Continued)

OTHER PUBLICATIONS

Banerjee, Kaustav, et al., "3-D Heterogeneous ICs: A Technology for the Next Decade and Beyond", *5th IEEE Workshop on Signal Propagation on Interconnects*, Venice, Italy, May 13-16, 2001.

(Continued)

*Primary Examiner*—Wael Fahmy
*Assistant Examiner*—John C Ingham
(74) *Attorney, Agent, or Firm*—Williams, Morgan & Amerson, P.C.

(57) ABSTRACT

An in-chip system and method for removing heat from integrated circuits is disclosed. One embodiment is a substrate with a front side and a back side. The front side of the substrate is capable of having formed thereon a plurality of transistors. A plurality of structures within the substrate contain a solid heat conductive media comprising carbon nanotubes and/or a metal, such as copper. At least some of the plurality of structures extend from the back side of the substrate into the substrate. In some embodiments, the carbon nanotubes are formed within the substrate using a catalyst.

17 Claims, 16 Drawing Sheets

U.S. PATENT DOCUMENTS

| | | | |
|---|---|---|---|
| 6,156,256 | A | 12/2000 | Kennel |
| 6,231,744 | B1 | 5/2001 | Ying et al. |
| 6,340,822 | B1 | 1/2002 | Brown et al. |
| 6,359,288 | B1 | 3/2002 | Ying et al. |
| 6,383,923 | B1 | 5/2002 | Brown et al. |
| 6,407,922 | B1 | 6/2002 | Eckblad et al. |
| 6,432,740 | B1 | 8/2002 | Chen |
| 6,448,509 | B1 * | 9/2002 | Huemoeller ............... 174/262 |
| 6,452,274 | B1 | 9/2002 | Hasegawa et al. |
| 6,504,292 | B1 | 1/2003 | Choi et al. |
| 6,713,151 | B1 | 3/2004 | Dean et al. |
| 6,744,072 | B2 | 6/2004 | Romano et al. |
| 6,800,886 | B2 | 10/2004 | Awano |
| 6,855,376 | B2 | 2/2005 | Hwang et al. |
| 6,856,016 | B2 * | 2/2005 | Searls et al. ............... 257/720 |
| 6,864,571 | B2 | 3/2005 | Arik et al. |
| 6,891,724 | B2 | 5/2005 | De Lorenzo et al. |
| 6,921,462 | B2 | 7/2005 | Montgomery et al. |
| 6,924,335 | B2 | 8/2005 | Fan et al. |
| 6,962,823 | B2 | 11/2005 | Empedocles et al. |
| 6,965,513 | B2 * | 11/2005 | Montgomery et al. ....... 361/687 |
| 6,988,531 | B2 * | 1/2006 | Chrysler et al. ............ 165/48.1 |
| 6,989,325 | B2 | 1/2006 | Uang et al. |
| 2002/0090501 | A1 | 7/2002 | Tobita |
| 2002/0100581 | A1 | 8/2002 | Knowles et al. |
| 2002/0130407 | A1 | 9/2002 | Dahl et al. |
| 2002/0145194 | A1 | 10/2002 | O'Connor et al. |
| 2002/0163079 | A1 * | 11/2002 | Awano ....................... 257/750 |
| 2003/0111333 | A1 | 6/2003 | Montgomery et al. |
| 2003/0117770 | A1 | 6/2003 | Montgomery et al. |
| 2003/0179559 | A1 * | 9/2003 | Engelhardt et al. .......... 361/780 |
| 2003/0231471 | A1 | 12/2003 | De Lorenzo et al. |
| 2004/0005736 | A1 | 1/2004 | Searls et al. |
| 2004/0013598 | A1 | 1/2004 | McElrath et al. |
| 2004/0053053 | A1 | 3/2004 | Jiang et al. |
| 2004/0101468 | A1 | 5/2004 | Liu et al. |
| 2004/0146560 | A1 | 7/2004 | Whiteford et al. |
| 2004/0150100 | A1 | 8/2004 | Dubin et al. |
| 2004/0182600 | A1 | 9/2004 | Kawabata et al. |
| 2004/0184241 | A1 | 9/2004 | De Lorenzo et al. |
| 2004/0191158 | A1 | 9/2004 | Liu et al. |
| 2004/0218362 | A1 | 11/2004 | Amaro et al. |
| 2004/0261978 | A1 | 12/2004 | Zhan et al. |
| 2004/0261987 | A1 | 12/2004 | Zhang et al. |
| 2004/0265489 | A1 | 12/2004 | Dubin |
| 2004/0266063 | A1 | 12/2004 | Montgomery et al. |
| 2004/0266065 | A1 | 12/2004 | Zhang et al. |
| 2005/0006754 | A1 | 1/2005 | Arik et al. |
| 2005/0037204 | A1 | 2/2005 | Osiander et al. |
| 2005/0061496 | A1 | 3/2005 | Matabayas |
| 2005/0067693 | A1 | 3/2005 | Nihei et al. |
| 2005/0092464 | A1 | 5/2005 | Leu et al. |
| 2005/0116336 | A1 | 6/2005 | Chopra et al. |
| 2005/0136248 | A1 | 6/2005 | Leu et al. |
| 2005/0139642 | A1 | 6/2005 | Koning et al. |
| 2005/0139991 | A1 | 6/2005 | White et al. |
| 2005/0150887 | A1 | 7/2005 | Taya et al. |
| 2005/0167647 | A1 | 8/2005 | Huang et al. |
| 2005/0224220 | A1 | 10/2005 | Li et al. |
| 2005/0238810 | A1 | 10/2005 | Scaringe et al. |
| 2005/0260412 | A1 | 11/2005 | Gardner |
| 2005/0269726 | A1 | 12/2005 | Matabayas, Jr. |

FOREIGN PATENT DOCUMENTS

| | | |
|---|---|---|
| WO | WO 03/054958 A1 | 7/2003 |
| WO | WO 03/072679 A1 | 9/2003 |
| WO | WO 03/107419 A1 | 12/2003 |

OTHER PUBLICATIONS

Cassell, Alan, "Directed Growth of Free-Standing Single-Walled Carbon Nanotubes", *J Am. Chemical Society*, 1999, 121, pp. 7975-7976.

Chiang, Ting-Yen, "A New Analytical Thermal Model for Multilevel ULSI Interconnects Incorporating Via Effect", Center for Integrated Systems, Stanford University (no date given).

Chiang, Ting-Yen, et al., "Effect of Via Separation and Low-k Dielectric Materials on the Thermal Characteristics of Cu Interconnects", *IEDM 2000* (no date).

Cui, Yi, et al., "Doping and Electrical Transport in Silicon Nanowires", *Journal of Physical Chemistry*. vol. 104, No. 22, Jun. 8, 2000, pp. 5213-5216.

de Pablo, P.J., "A Simple, Reliable Technique For Making Electrical Contact To Multiwalled Carbon Nanotubes", *Applied Physics Letters*, vol. 74, No. 2, Jan. 11, 1999, pp. 323-325.

Delzeit, Lance, et al., "Growth Of Carbon Nanotubes By Thermal And Plasma Chemical Vapour Deposition Processes And Applications In Microscopy", *Nanotechnology*, vol. 13, May 23, 2002, pp. 280-284.

Delzeit, Lance, et al., "Growth Of Multiwall Carbon Nanotubes In An Inductively Coupled Plasma Reactor", *Journal of Applied Physics*, vol. 91, No. 9, May 1, 2002, pp. 6027-6033.

Goodson, K.E., et al., "Improved Heat Sinking For Laser-Diode Arrays Using Microchannels In CVD Diamond", *IEE Transactions on Components, Packaging, and Manufacturing Technology*, Part B, Advanced Packaging, vol. 20, Issue 1, Feb. 1997. pp. 104-109.

Hone, J., et al., "Thermoelectric Power of Single-Walled Carbon Nanotubes", *Physical Review Letters*, vol. 80, No. 5, Feb. 2, 1998, pp. 1042-1045.

Huang, Z.P., et al. "Growth Of Highly Oriented Carbon Nanotubes By Plasma-Enhanced Hot Filament Chemical Vapor Deposition", *Applied Physics Letters*, vol. 73, No. 26, Dec. 28, 1998, pp. 3845-3847.

*International Semiconductor Road Map* (ITRS-2001), Section on Interconnect, http://public/itrs.net/files/2001ITRS/interconnect.pdf.

Jun Li et al., Bottom Up Approach for Carbon Nanotube Interconnects, Applied Phys. Letter, Apr. 18, 2003, 2491-2493, vol. 82, No. 15, American Institute of Physics.

Jun Li et al., "Electronic Properties of Multiwalled Carbon Nanotubes in an Embedded Vertical Array", Applied Phys. Letters 29, Jul. 2002, 910-912, vol. 81, No. 5, American Institute of Physics.

Kim, Mun Ja, et al., "Growth Characteristics of Carbon Nanotubes via Aluminum Nanopore Template on Si Substrate Using PECVD", Elsevier Thin Solid Films, vol. 425, 2003, pp. 312-317.

Kong, Jing, et al. "Synthesis of Individual Single-Walled Carbon Nanotubes On Patterned Silicon Wafers", *Nature*, vol. 395, Oct. 29, 1998, pp. 878-881.

Kurabayashi, K, et al., "Precision Measurement and Mapping of Die-Attach Thermal Resistance", *IEEE Transactions on Components, Packaging, and Manufacturing Technology*, Part A: Advanced Packaging, vol. 21, Issue 3, Sep. 1998. pp. 506-514.

Liu, Jie, et al., "Controlled Deposition Of Individual Single-Walled Carbon Nanotubes On Chemically Functionalized Templates", *Chemical Physics Letters*, 303, Apr. 2, 1999, pp. 125-129.

McEuen, Paul L., et al., "Single-Walled Carbon Nanotube Electronics", *IEEE Transactions on Nanotechnology*, vol. 1, No. 1, Mar. 2002, pp. 78-85.

Meyyappan, M., et al., "Carbon Nanotube Growth by PECVD: a review", Plasma Sources Science and Technology, vol. 12, Apr. 2, 2003, pp. 205-216.

Ren, Z.F., et al., "Synthesis of Large Arrays of Well-Aligned Carbon Nanotubes on Glass", *Science*, vol. 282, Nov. 6, 1998, pp. 1105-1107.

Shi, Li., "A Microdevice for Measuring Thermophysical Properties of Nanowires and Nanotubes", *2001 ASME International Mechanical Engineering Congress and Exposition*, Nov. 11-16, 2001, pp. 359-362.

Shi, Li., "Scanning Thermal Microscopy Of Carbon Nanotubes Using Batch-Fabricated Probes", *Applied Physics Letters* vol. 77, No. 26, Dec. 25, 2000, pp. 4295-4297.

Stevens, R., "Improved Fabrication Approach For Carbon Nanotube Probe Devices", *Applied Physics Letters*, vol. 77, No. 21, Nov. 20, 2000, pp. 3453-3455.

Sun, X, et al., "Theoretical Modeling Of Thermoelectricity In Bi Nanowires", *Applied Physics Letters*, vol. 74, No. 26, Jun. 28, 1999, pp. 4005-4007.

Tu et al., Growth of Aligned Carbon Nanotubes with Controlled Site Density, Applied Phys. Letters, May 27, 2002, 4018-4020, vol. 80, No. 21, American Institute of Physics.

Yakobson, Boris I., et al., "Fullerene Nanotubes: $C_{1,000,000}$ and Beyond", *American Scientist online*, http://www.americanscientist.org/template/AssetDetail/assetid/2870?fulltext=true&print=yes.

Zhang, Yuegang, et al., "Electric-Field-Directed Growth Of Aligned Single-Walled Carbon Nanotubes", *Applied Physics Letters*. vol. 79, No. 19, Nov. 5, 2001, pp. 3155-3157.

Zhang, Wei De, et al., "Synthesis Of Vertically Aligned Carbon Nanotubes Films On Silicon Wafers By Pyrolysis Of Ethylenediamine", *Elsevier, Thin Solid Films*, 422, 2002, pp. 120-125.

Zhou, P., et al., "Thermomechanical Diagnostics of Flip-Chip/BGA Structures Using Phase-Shifting Electronic Speckle Pattern Interferometry", *EEP, Advances in Electronic Packaging*, vol. 26-2, ASME, 1999, pp. 1875-1880.

* cited by examiner

IN-CHIP STRUCTURES AND METHODS FOR REMOVING HEAT FROM INTEGRATED CIRCUITS

RELATED APPLICATIONS

This application claims the benefit of U.S. Provisional Application No. 60/687,289, filed Jun. 2, 2005, which application is incorporated by reference herein in its entirety.

This application is a continuation-in-part of U.S. patent application Ser. No. 10/762,666, filed Jan. 22, 2004 now abandoned, entitled "Method and Apparatus for the Use of Self-Assembled Nanowires for the Removal of Heat From Integrated Circuits," which in turn claims the benefit of U.S. Provisional Application No. 60/442,450, filed Jan. 24, 2003. These two applications are incorporated by reference herein in their entirety.

TECHNICAL FIELD

The disclosed embodiments relate generally to the removal of heat from an integrated circuit. More particularly, the disclosed embodiments relate to in-chip structures and methods to enhance heat conduction out of an integrated circuit.

BACKGROUND

Current techniques to cool semiconductor ICs (integrated circuits) use chip packages with externally mounted, finned heat sinks coupled to the ceramic or plastic encapsulated IC chip. As the speed and density of modern ICs increase, the power generated by these chips also increases, often in geometric proportion to increasing density and functionality. In the video processing and CPU (central processing unit) application areas, the ability to dissipate the heat being generated by current ICs is becoming a serious limitation in the advance of technology. While some aspects of the problem can be mitigated by forced convection devices such as fans (and even liquid cooling), the core of the problem is now shifting to the thermal resistances within the chip itself. Reducing the outer package surface temperature is producing diminishing returns due to the high heat fluxes being generated at the semiconductor junctions, and the relatively poor thermal conductivity of the materials between the junction and the outer package surface. This problem is producing high junction temperatures that directly affect chip reliabilities. Other than the available chip design techniques used to minimize IC power generation (e.g., lowering voltage, clocking schemes to turn-off transistors when inactive, and decreasing the size of specific, non-critical transistors), the current art does not provide efficient solid structures inside the chip to carry heat out and reduce junction temperatures.

Heat generated near or at the silicon active devices (semiconductor junctions) is dissipated through two paths:

(a) through the inter-metal dielectrics and metal layers to the top bonding layer, or (b) through the bulk silicon towards the bottom of the wafer where thermal contact is made to the back of the chip with the package's heat sink.

Both paths have high thermal resistance. In the current art, the limiting factors are the 'insulator' thermal characteristics of dielectrics and bulk silicon materials. More limiting yet is the fact that the path to heat conduction is usually at the bottom or back of the chip through the bulky silicon substrate. As the number of metal and insulator layers grows to accommodate chip interconnect, an increase of their temperature is anticipated. With heat sinking only at one side of the chip it becomes harder to 'cool' the chip. As a result, large and fast-switching transistors can have their individual junction temperature rise above certain maximum values. This is also true for metal wires with high current and switching activity.

SUMMARY

The present invention addresses the problems described above by providing in-chip structures in close proximity to the power generating semiconductor junctions that more efficiently conduct heat to the IC's outer surfaces. Such structures are compatible with current semiconductor fabrication technology, provide significantly lower thermal resistances, and are low cost.

One aspect of the invention involves a method for fabricating a heat conduction device in an integrated circuit comprising the steps of (1) fabricating at least one transistor in a silicon substrate, (2) depositing a first dielectric layer on the top surface of the transistor, (3) depositing a metal catalyst layer on the surface of the first dielectric layer, (4) depositing a second dielectric layer on the surface of the metal catalyst layer, (5) etching at least one cavity through the second dielectric layer to the top surface of the metal catalyst layer, the cavity being located above the transistor. In step (6) at least one carbon nanotube is grown within the cavity, the carbon nanotube extending from the top surface of the metal catalyst layer to at least the top horizontal surface of the second dielectric layer, and in step (7) a metallic, heat conducting layer is deposited on the top surface of the second dielectric layer, such that heat generated by the transistor is conducted from the top surface of the transistor to the metallic, heat conducting layer through the carbon nanotube.

Another aspect of the invention involves a method for fabricating a heat conduction device in an integrated circuit die comprising the steps of (1) fabricating at least one transistor in a top surface of a silicon substrate, (2) cutting at least one cavity within the silicon substrate, the cavity extending through a back surface of the silicon substrate below the transistor, (3) depositing a catalyst layer within the cavity, and (4) growing a plurality of carbon nanotubes within the cavity, the carbon nanotubes extending from a bottom surface of the cavity to the back surface of the silicon substrate.

Another aspect of the invention involves a heat conducting device within an integrated circuit structure, comprising a heat conductive network extending from a top surface of an active device layer, through a plurality of interconnect levels, to a top surface of the integrated circuit structure. The heat conductive network comprises a plurality of heat conductive vias traversing the plurality of interconnect levels. The heat conductive vias are electrically isolated from metal conductors of the interconnect levels. Heat generated by active devices in the active device layer is conducted through the heat conductive network to the top surface of the integrated circuit structure.

Another aspect of the invention involves an integrated circuit die having enhanced power dissipation, comprising a substrate, having a top surface upon which power generating devices of the integrated circuit die are fabricated, the substrate having a backside surface essentially parallel to the top surface. The integrated circuit die of the present invention further comprises at least one cavity, extending from the backside surface a predetermined distance toward the top surface, the predetermined distance being less than the distance between the top surface and the backside surface, and a heat conductive media contained within the cavity, the media having a thermal conductivity greater than a bulk thermal conductivity of the substrate, such that heat produced by the power generating devices is transferred to the backside surface via the heat conductive media.

Another aspect of the invention involves a substrate with a front side and a back side. The front side of the substrate is capable of having formed thereon a plurality of transistors. A plurality of structures within the substrate contain a solid heat conductive media comprising carbon nanotubes. At least some of the plurality of structures extend from the back side of the substrate into the substrate.

Another aspect of the invention involves an integrated circuit die with a plurality of transistors formed on the front side of a substrate. A plurality of structures within the substrate contain a solid heat conductive media comprising carbon nanotubes. At least some of the plurality of structures extend from the back side of the substrate into the substrate.

Another aspect of the invention involves an integrated circuit die coupled to a heat sink. The integrated circuit die has a plurality of transistors formed on the front side of a substrate. A plurality of structures within the substrate contain a solid heat conductive media comprising carbon nanotubes. At least some of the plurality of structures extend from the back side of the substrate into the substrate.

Another aspect of the invention involves a method in a substrate with a front side and a back side. The front side of the substrate is capable of having formed thereon a plurality of transistors. The method involves forming a plurality of structures within the substrate that contain a solid heat conductive media comprising carbon nanotubes. At least some of the plurality of structures extend from the back side of the substrate into the substrate.

Another aspect of the invention involves a method in a substrate with a front side and a back side. The method involves generating heat with a plurality of transistors formed on the front side of the substrate; and conducting at least some of the heat to the back side of the substrate via a plurality of structures within the substrate that contain a solid heat conductive media comprising carbon nanotubes. At least some of the plurality of structures extend from the back side of the substrate into the substrate.

Another aspect of the invention involves a substrate with a front side and a back side. The front side of the substrate is capable of having formed thereon a plurality of transistors. A plurality of structures within the substrate contain a solid heat conductive media comprising copper. At least some of the plurality of structures extend from the back side of the substrate into the substrate.

Another aspect of the invention involves an integrated circuit die with a plurality of transistors formed on the front side of a substrate. A plurality of structures within the substrate contain a solid heat conductive media comprising copper. At least some of the plurality of structures extend from the back side of the substrate into the substrate.

Another aspect of the invention involves an integrated circuit die coupled to a heat sink. The integrated circuit die has a plurality of transistors formed on the front side of a substrate. A plurality of structures within the substrate contain a solid heat conductive media comprising copper. At least some of the plurality of structures extend from the back side of the substrate into the substrate.

Another aspect of the invention involves a method in a substrate with a front side and a back side. The front side of the substrate is capable of having formed thereon a plurality of transistors. The method involves forming a plurality of structures within the substrate that contain a solid heat conductive media comprising copper. At least some of the plurality of structures extend from the back side of the substrate into the substrate.

Another aspect of the invention involves a method in a substrate with a front side and a back side. The method involves generating heat with a plurality of transistors formed on the front side of the substrate; and conducting at least some of the heat to the back side of the substrate via a plurality of structures within the substrate that contain a solid heat conductive media comprising copper. At least some of the plurality of structures extend from the back side of the substrate into the substrate.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures. For clarity, features in some figures are not drawn to scale.

DESCRIPTION OF EMBODIMENTS

In-chip structures and methods to remove heat from an IC are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention as defined by the appended claims.

Moreover, in the following description, numerous specific details are set forth to provide a thorough understanding of the present invention. However, it will be apparent to one of ordinary skill in the art that the invention may be practiced without these particular details. In other instances, methods, procedures, and components that are well known to those of ordinary skill in the art are not described in detail to avoid obscuring aspects of the present invention.

Figure 1:
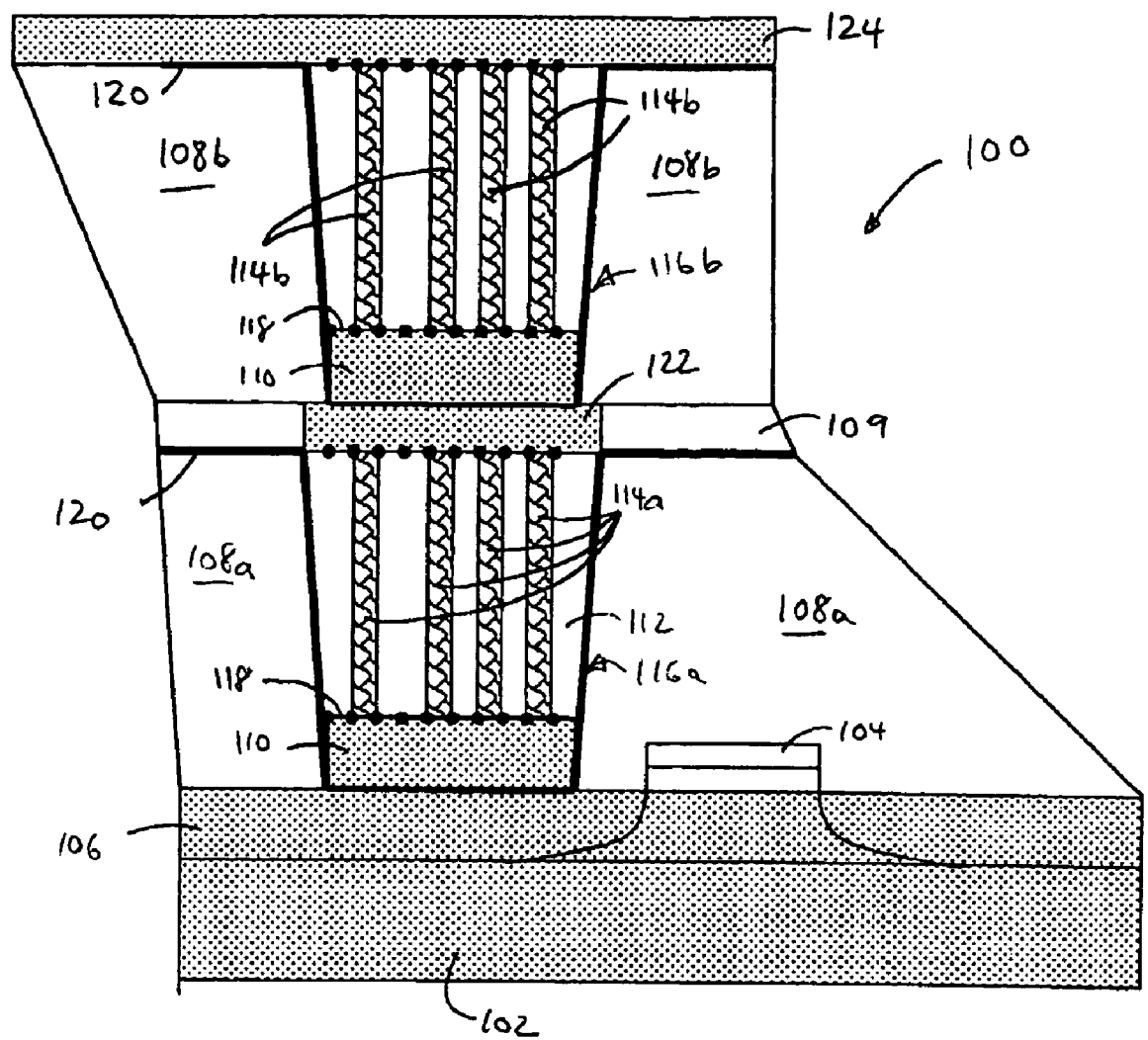
FIG. 1 is a schematic cross section of an integrated circuit structure having heat conducting, carbon nanotube filled vias located above a transistor junction according to one embodiment of the present invention.

FIG. 1 is a schematic cross section of an integrated circuit structure 100 having heat conducting, carbon nanotube filled vias 116a,b located above a transistor junction according to one embodiment in the present invention. The silicon substrate 102 of the integrated circuit structure supports an active device layer 106 within which the junctions of the high power transistors are fabricated. Typically, a high-speed integrated circuit will have a number of transistors that must dissipate relatively high power levels. These transistors will generally be functioning as clock drivers, bus line drivers, and I/O buffers and drivers. The high capacitance of the loads driven by these transistors aggravated by the very high switching frequencies, can create significant power generation, even in so called low power CMOS circuitry. Because this heat generation is localized to areas near the drain and source regions of these drive transistors, it would be of considerable benefit to remove heat from these localized hot spots if possible. FIG. 1 illustrates a subsection of a micron scale, heat conduction network designed to remove heat from localized areas on an integrated circuit die, such as power transistors or other high heat generation areas (such as laser diodes or passive components such as resistors). In some embodiments, heat conductive via 116a is placed directly over a power generating transistor, the gate 104 of which extends into inter metal dielectric 108a. A second heat conductive via 116b is placed in line directly above via 116a, in thermal contact with via 116a, to provide a high conductivity path through both vias. In this manner heat generated at layer 106 may be effectively transferred out of active device layer 106, where the device junctions are located. Although only two vias are illustrated, it will be obvious to those skilled in the art that any number of vias may be stacked to reach the top surface of the integrated circuit chip. Normally, heat is transferred out of the chip in this direction due to the poor thermal conductivity of the multiple stacks of inter-metal dielectrics. Due to the repetitive multilayer process necessary for multiple layers of interconnect, a single via is designed to traverse one layer of metal interconnect, which includes the intermetal dielectric and metal interconnect layers. For example, via 116a extends from the top surface of the active device layer 106, through inter-metal dielectric 108a, terminating within layer 109, which would be at the same level as the first level metal interconnect for device 100. It should be noted that via 116a is electrically isolated from any metal interconnect layer, even though its top region is terminated in a metal layer 122. Metal layer 122 is primarily used to terminate the tops of any carbon nanotubes 114a (if present), and provide a high thermal conductivity transition to via 116b above. In the event that via 116b cannot be located directly above via 116a, for example, metal layer 122 may also be used to aid lateral heat conduction.

The vias 116a and 116b of FIG. 1 are shown containing carbon nanotubes 114a and 114b, respectively. Alternatively, the vias may be filled with a pure metal or metal alloy, such as copper, aluminum, tungsten, or alloys or mixtures of these metals. Carbon nanotubes are preferable even compared to a metal such as copper, since arrays of carbon nanotubes may have a thermal conductivity five times higher, exceeding 2000 Watts/m/degree Kelvin. Carbon nanotubes 114 may be present within the vias along with voids between the nanotubes. The voids may be filled with a secondary material such as copper, aluminum, tungsten or other metal. The voids may also be filled with a dielectric such as silicon dioxide, but preferably the voids are filled with a heat conductive material such as a metal or metal alloy. At the base of via 116a is a catalyst layer 110 for nucleating the carbon nanotube growth. The catalyst layer 110 is comprised of a metal, preferably nickel or cobalt, or alloys or mixtures containing nickel or cobalt. Silicides of nickel or cobalt may also be used. Contents of the vias are isolated from the surrounding dielectric layers 108a,b and active device layer 106 by a barrier layer 120 (e.g., SiN). Carbon nanotubes 114 are grown from top surface 118 of the catalyst layer 110 at the bottom of via 116, to a length generally extending above metal layers 122 or 124. A number of deposition techniques are known for growing carbon nanotubes. Preferably, the carbon nanotubes are grown using plasma enhanced chemical vapor deposition (PECVD), as has been recently reported in the scientific literature and is known to those skilled in the art. Metal layers 122/124 are deposited, followed by a planarization step (usually CMP) to trim the tops of the nanotubes level with the top surface of the metalization layer 122/124. Carbon nanotubes 114 are preferably grown as uninterrupted, continuous vertical tubes from the base of the via to the top, due to the relatively small dimension between metal interconnect layers.

Figure 2:
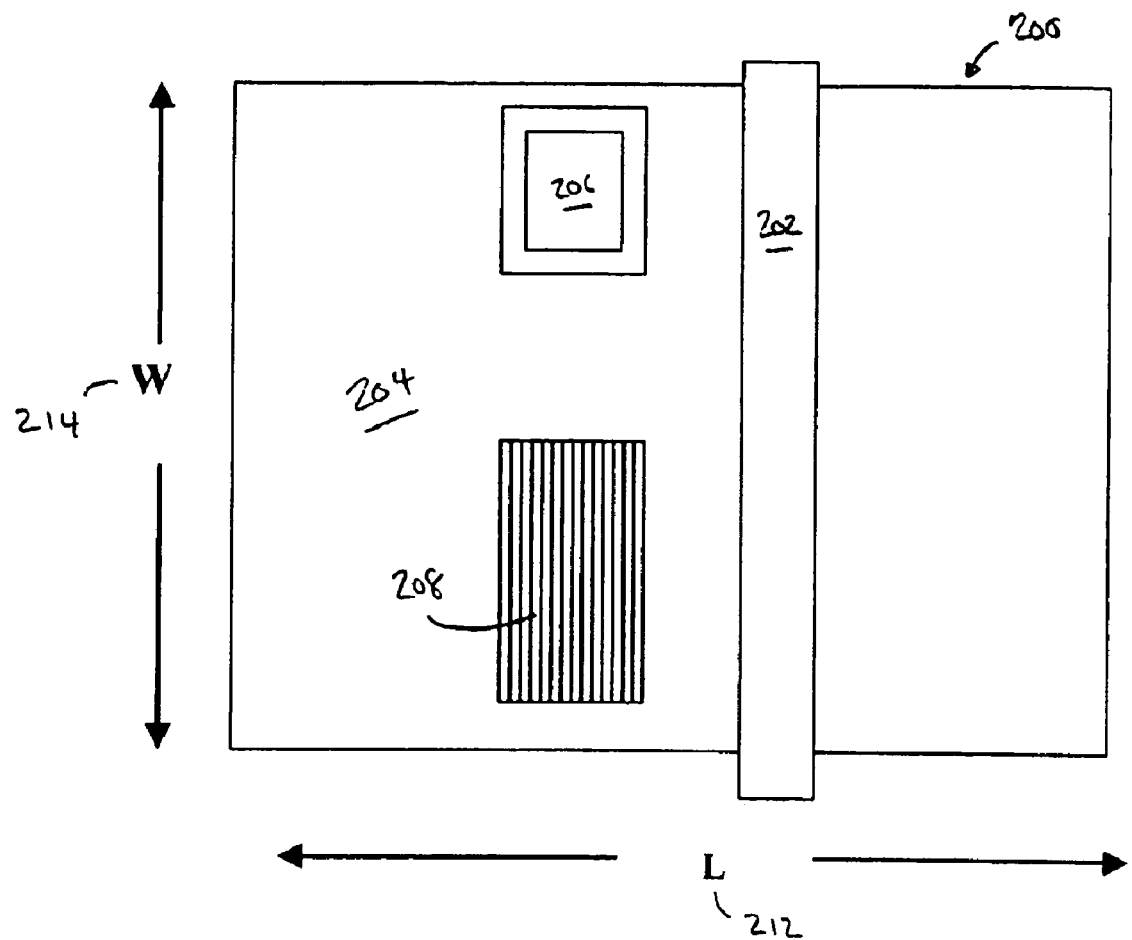
FIG. 2 is a schematic top view of an integrated circuit transistor indicating a possible location of a heat conducting via according to one embodiment of the present invention.

FIG. 2 is a schematic top view of an integrated circuit transistor indicating a possible location of a heat conducting via 208 according to one embodiment of the present invention. CMOS transistor 200 having a width W (214) and length L (212) is shown with gate contact 202 and source/drain area 204, and source/drain contact 206. Most of the heat generated by transistor 200 will emanate from the source/drain area 204. Placing a via 208 directly over the source/drain region of the transistor will greatly aid in removing heat where it is generated, reducing subsequent junction temperatures. Via 208 can be sized to cover as much area as practical. Although via 208 is shown above the source/drain region in this top view, it is also possible to provide a cavity or via in the substrate below the transistor 200, as will be discussed below.

Figure 3:
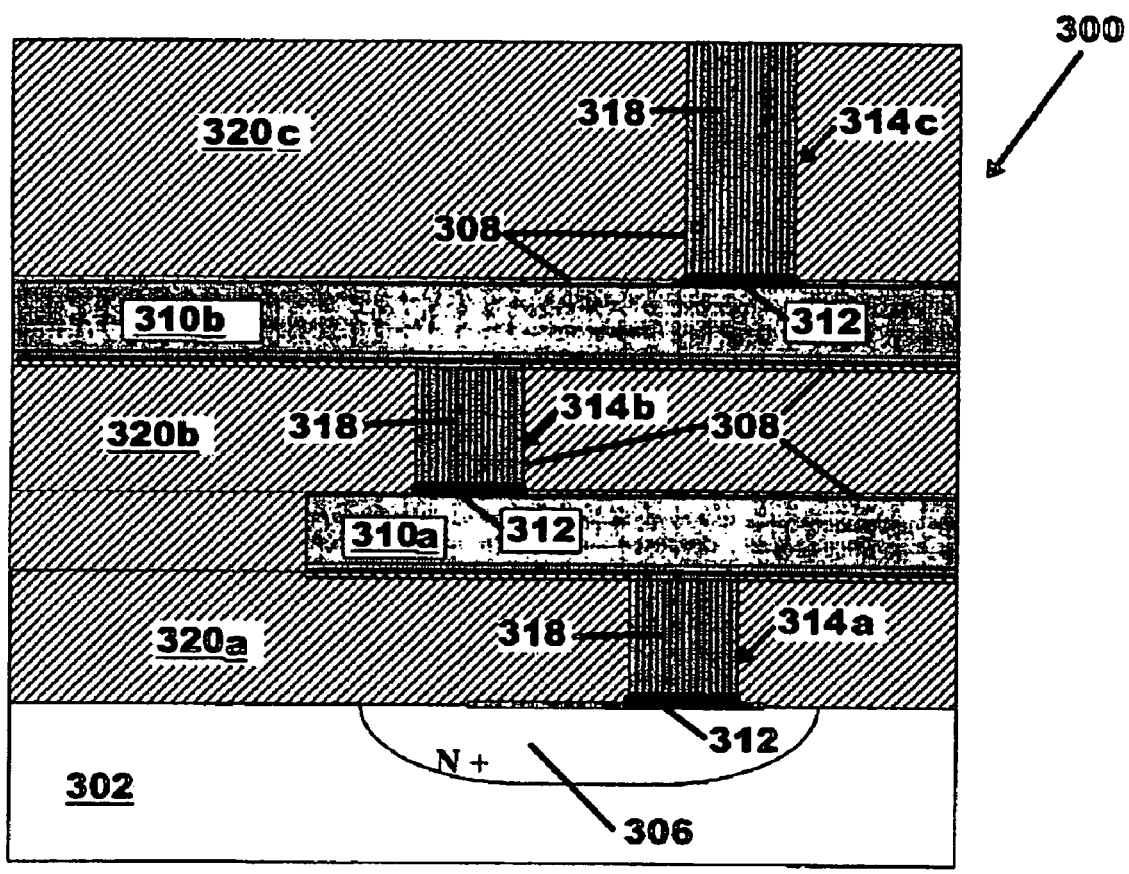
FIG. 3 is a schematic cross section of an integrated circuit structure having multiple heat conducting vias extending through multiple layers of metal interconnect according to one embodiment of the present invention.

FIG. 3 is a schematic cross section of an integrated circuit structure 300 having multiple heat conducting vias 314 extending through multiple layers of metal interconnect according to one embodiment of the present invention. Substrate 302 contains an N doped region 306 representing a generic drain/source region of a heat generating transistor. Via 314a is placed directly over the heat generating region 306. Vias 314a-c make up a heat conducting network for transferring heat from transistor drain/source regions to the top surface of the integrated circuit die. In this example, vias 314a-c are not oriented directly above one another, but are in a staggered configuration. In this configuration, some lateral heat conduction within metal layers 310a and 310b is required to complete the heat transfer from via 314a to 314c. Although metal layers 310 are at the same vertical position as the signal interconnect levels, they are not electrically connected to them. In other words, the heat conduction network comprising vias 314a-c and portions of metal layers 310a-b are electrically isolated from the transistors and the electrical interconnects for the transistors. In some embodiments, the heat conduction network may be tied to a ground. Inter-metal dielectric layers are shown as 320a-c. In this example, vias 314a-c are filled with carbon nanotubes 318, grown from a catalyst layer 312. Alternatively, vias 314a-c may be filled with a conductive metal, as previously discussed above. Barrier layers 308 provide isolation of metal compounds contained within the vias, and may be a nitride compound, preferably silicon nitride, although titanium nitride may also be used for some vias (e.g., vias 314b and 314c).

Figure 4:
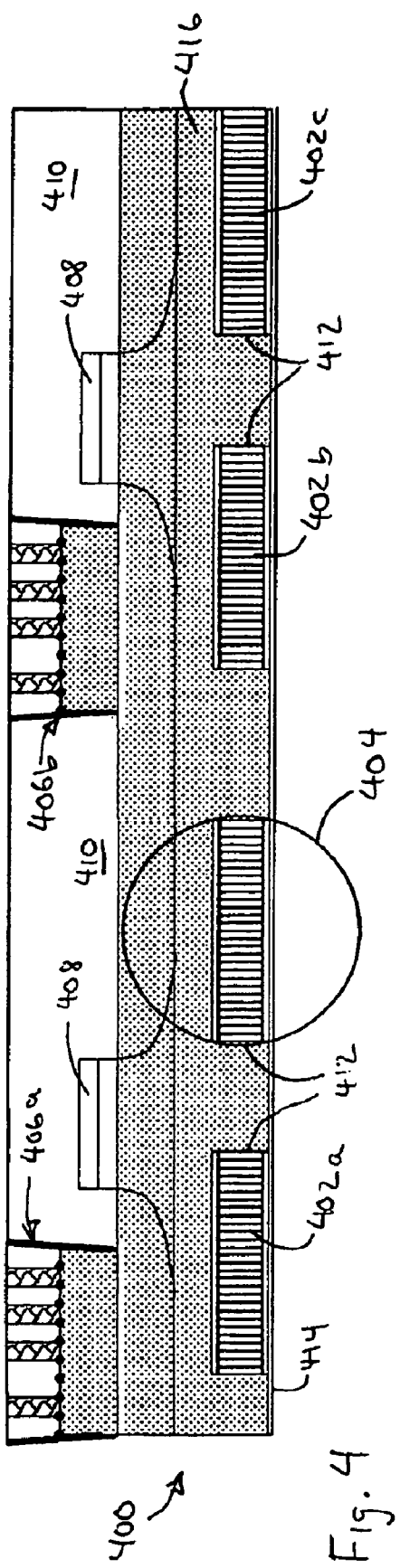
FIG. 4 is a schematic cross section of an integrated circuit structure having carbon nanotube filled heat conduction structures integrated into the backside of the silicon substrate according to one embodiment of the present invention.

FIG. 4 is a schematic cross section of an integrated circuit structure 400 having carbon nanotube filled heat conduction structures 402a-c integrated into the backside of the silicon substrate according to one embodiment of the present invention. In this embodiment, heat conduction from power generating regions of the integrated circuit structure are aided by cavities or channels 412 cut into the back surface 414 of the substrate 416 to supplement heat transferred from the top side of the substrate though vias 406a,b (not to scale) extending through the first inter-metal dielectric layer 410. Structures 402a-c may be used with or without vias 406. As previously noted, cavities 412 may preferably be filled with carbon nanotubes, or with a conductive media such as metal. The cavities are preferably located below the power generating regions of the integrated circuit structure, such as the drain/source regions of CMOS transistors with gates 408. To aid in increasing heat transfer and reducing the depths of the cavities, substrate 416 may be backside ground to thin the substrate. A detailed view of a carbon nanotube filled cavity 404 is shown in FIG. 5.

Figure 5:
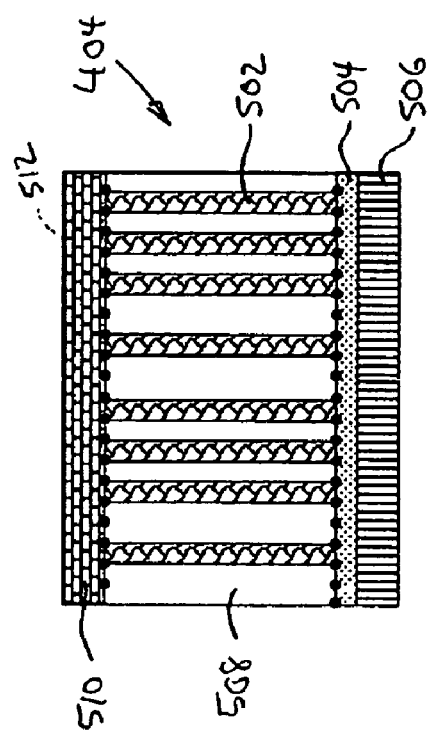
FIG. 5 is an enlarged schematic of a carbon nanotube filled heat conduction structure 404 of FIG. 4.

FIG. 5 is an enlarged schematic of a carbon nanotube filled heat conduction structure 404 of FIG. 4. Heat conducting structure 404 comprises a cavity filled with carbon nanotubes 502. The catalyst layer 510 is located at the bottom surface 512 of the cavity, the carbon nanotubes being grown from catalyst layer 510 to just beyond the back surface 414 of the substrate. Following a subsequent metal layer deposition (504, 506) on the back surface 414, the back surface may be planarized to cut off any nanotubes extending beyond the back surface, creating a flat, metallic surface layer 506 to which further heat sinking can be bonded. The interstitial voids 508 between carbon nanotubes 502 may be filled as previously discussed above.

Figure 6:
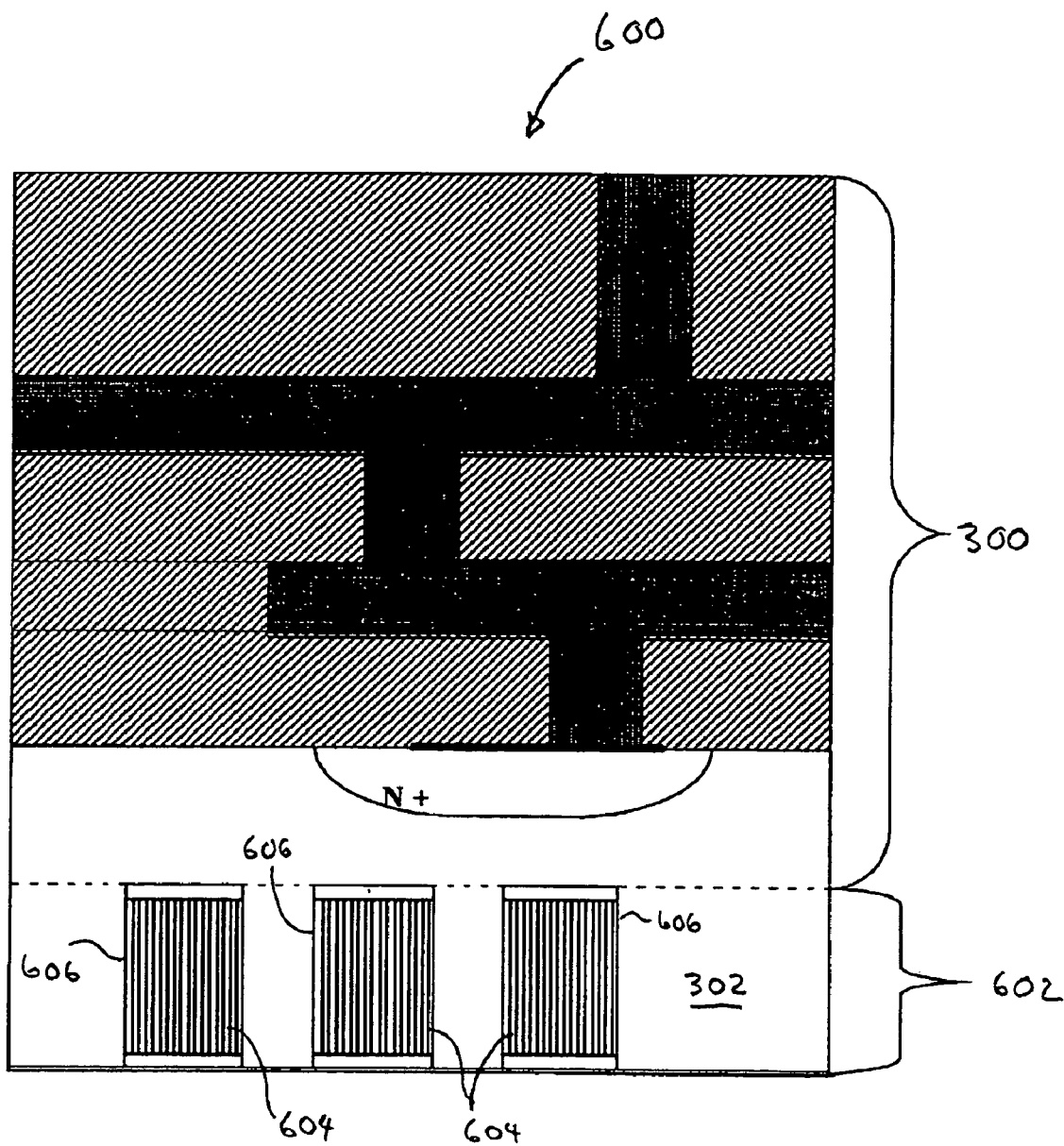
FIG. 6 is a schematic cross section of an integrated circuit structure having both heat conducting vias and backside heat conduction structures according to one embodiment of the present invention.

FIG. 6 is a schematic cross section of an integrated circuit structure 600 having both heat conducting vias and backside heat conduction structures 604 according to one embodiment of the present invention. Integrated circuit structure 600 is shown having the staggered via heat conduction network 300 of FIG. 3, coupled with backside conduction embodiment 602. Embodiment 602 comprises carbon nanotube containing heat conduction media 604 enclosed within cavities 606 cut into the backside surface of substrate 302.

Figure 7A:
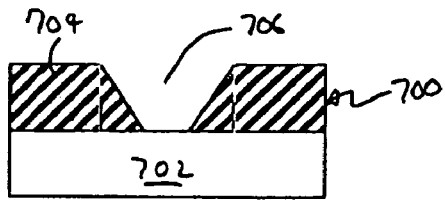
FIGS. 7a-e (Prior Art) are schematic cross sections of an integrated circuit structure during the damascene process for filling a via.
Figure 7B:
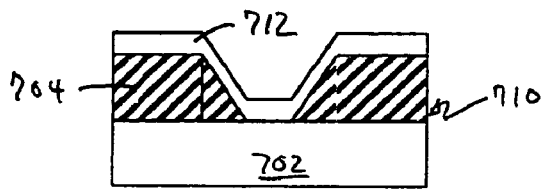
Figure 7C:
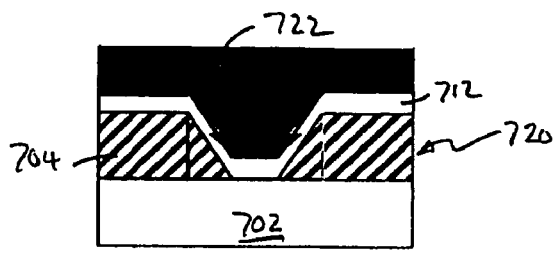
Figure 7D:
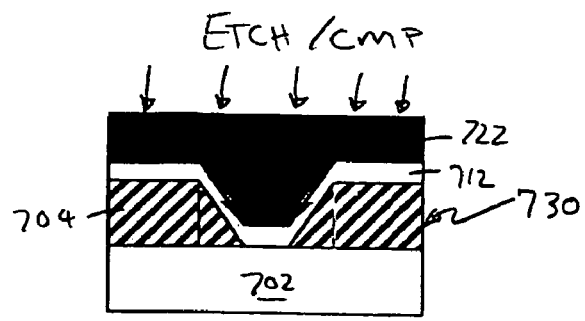
Figure 7E:
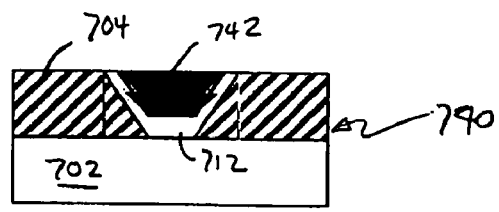

FIGS. 7a-e (Prior Art) are schematic cross sections of an integrated circuit structure during the damascene process for filling a via. This process will be reviewed briefly for comparison to a subsequent embodiment of the present invention. In FIG. 7a, oxide layer 704 is grown over an aluminum or silicon substrate 702, then via 706 is etched within oxide 704 to expose a portion of substrate 702, leaving structure 700. In FIG. 7b, a TiN barrier layer 712 is deposited over the oxide 704 and exposed substrate 702, as in 710. In FIG. 7c, a metal layer 722 (such as tungsten) is deposited over barrier layer 712, filling the via in the process, resulting in structure 720. In FIGS. 7d and 7e, the metal layer is etched back and subsequently planarized via CMP (chemical-mechanical-planarization), removing the metal layer and barrier layer above the top surface of the oxide, but leaving the via filled with the metal 742, as in structure 740.

Figure 8A:
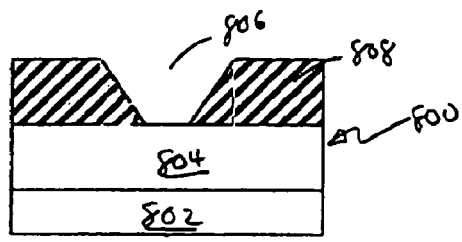
FIGS. 8a-e are schematic cross sections of an integrated circuit structure during a process for filling a carbon nanotube containing heat conduction via according to one embodiment of the present invention.
Figure 8D:
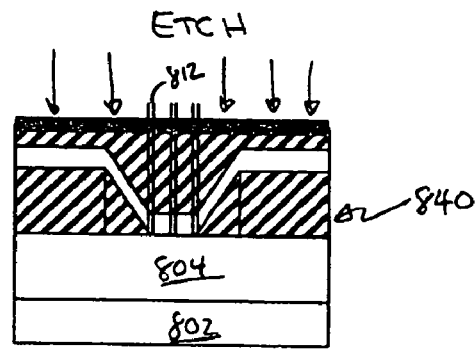
Figure 8B:
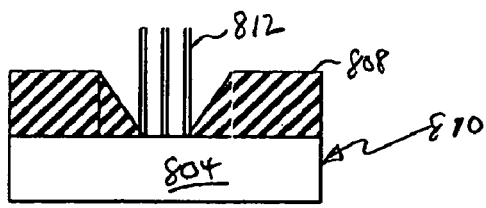
Figure 8C:
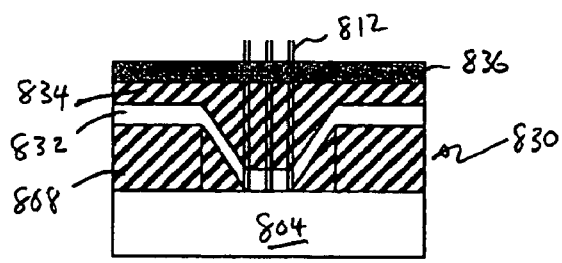
Figure 8E:
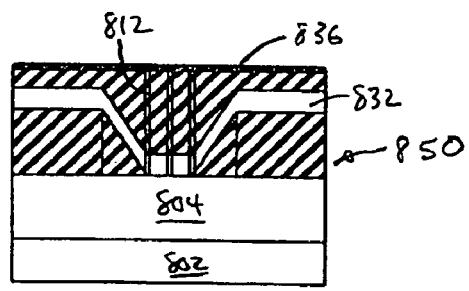

FIGS. 8a-e are schematic cross sections of an integrated circuit structure during a process for filling a carbon nanotube containing heat conduction via according to one embodiment of the present invention. In FIG. 8a a first dielectric layer 802 is deposited over the substrate. In some embodiments, the first dielectric layer is silicon oxide or silicon nitride. A metal catalyst layer 804 is deposited on the surface of the first dielectric layer 802. Preferably the metal catalyst layer 804 is a metal compound or alloy containing nickel, cobalt, or both. Less preferably, the metal catalyst layer may contain nickel or cobalt silicides. A second dielectric layer 808 is deposited over the metal catalyst layer 804, and is preferably silicon nitride. Subsequent etching produces a cavity 806 through the second dielectric layer 808, to the top surface of the metal catalyst layer, resulting in structure 800. In FIG. 8b, carbon nanotubes 812 are selectively grown from the exposed catalyst surface at the bottom of cavity (via) 806, producing structure 810. Preferably, the carbon nanotubes are grown using plasma enhanced chemical vapor deposition (PECVD). In FIG. 8c, a third dielectric layer 832 (e.g., $SiO_2$) is grown over the surface of dielectric 808. A fourth dielectric 834 is then grown over dielectric 832, followed by a metal layer 836, finally resulting in structure 830. In FIGS. 8d and 8e, metal layer 836 is etched, then planarized with CMP, resulting in structure 850.

Figure 8F:
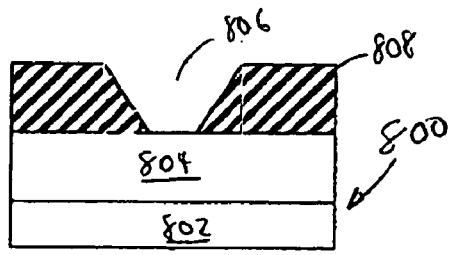
FIGS. 8f-i are schematic cross sections of an integrated circuit structure during a streamlined process for filling a carbon nanotube containing heat conduction via according to one embodiment of the present invention.
Figure 8G:
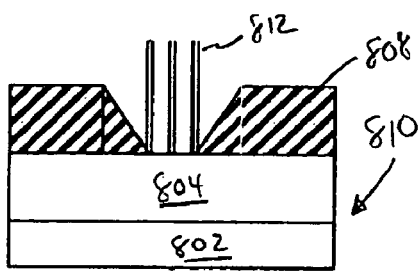
Figure 8H:
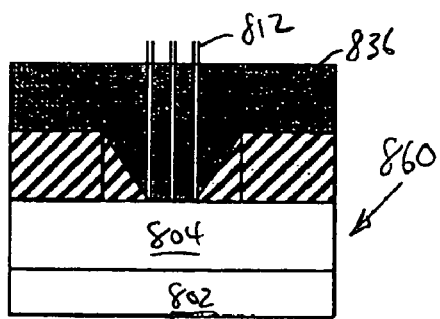
Figure 8I:
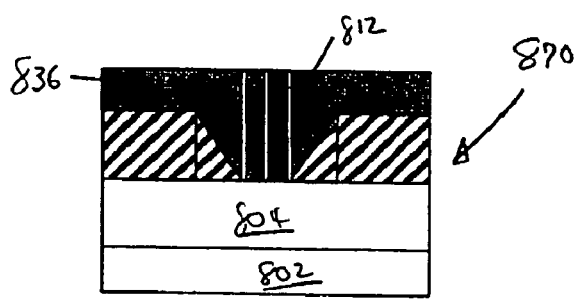

FIGS. 8f-i are schematic cross sections of an integrated circuit structure during a streamlined process for filling a carbon nanotube containing heat conduction via according to one embodiment of the present invention. In FIG. 8f a first dielectric layer 802 is deposited over the substrate. Preferably, the first dielectric layer is silicon nitride, or less preferably, titanium nitride. A metal catalyst layer 804 is deposited on the surface of the first dielectric layer 802. Preferably the metal catalyst layer 804 is a metal compound or alloy containing nickel, cobalt, or both. Less preferably, the metal catalyst layer may contain nickel or cobalt silicides. A second dielectric layer 808 is deposited over the metal catalyst layer 804, and is preferably silicon nitride. Subsequent etching produces a cavity 806 through the second dielectric layer 808, to the top surface of the metal catalyst layer, resulting in structure 800. In FIG. 8g, carbon nanotubes 812 are selectively grown from the exposed catalyst surface at the bottom of cavity (via) 806, producing structure 810. Preferably, the carbon nanotubes are grown using plasma enhanced chemical vapor deposition (PECVD). The carbon nanotubes extend from the bottom of the cavity to at least the top surface of the second dielectric layer 808. In FIG. 8h, a metallic, heat conducting layer is deposited over the surface of dielectric layer 808. The metallic, heat conducting layer may be made from any metal or alloy, but preferably copper, and less preferably aluminum or tungsten. Following metal deposition, the structure 860 results. In FIG. 8l, metallic, heat conducting layer 836 is planarized, producing structure 870.

A wide variety of different articles of manufacture can be made with improved thermal conductivity.

One article of manufacture is a substrate with a front side and a back side. The front side of the substrate is capable of having formed thereon a plurality of transistors. A plurality of structures within the substrate contain a solid heat conductive media with a thermal conductivity greater than the thermal conductivity of the substrate without the heat conductive media. In some embodiments, the heat conductive media comprises carbon nanotubes and/or copper. In some embodiments, the structures comprise filled cavities, e.g., cavities filled with carbon nanotubes, copper, and/or other materials such that the average thermal conductivity of the substrate is increased by the filled cavities. For example, if the substrate is a silicon wafer, the average thermal conductivity of the substrate will be increased if the substrate contains a plurality of cavities filled with carbon nanotubes and/or copper because both carbon nanotubes and copper have a thermal conductivity greater than silicon.

In some embodiments, the carbon nanotubes are formed within the substrate using a catalyst. In some embodiments the copper is formed within the substrate using a seed layer. In some embodiments, the structures have a density of greater than 1 per $mm^2$ over a substrate area corresponding to at least one die.

In some embodiments, the substrate is a silicon substrate. In some embodiments, the substrate is a silicon-on-insulator (SOI) substrate with a silicon layer on top of an insulating layer. In some embodiments, at least some of the plurality of structures extend from the back side of the substrate into the substrate. In some embodiments, at least some of the plurality of structures contact the insulating layer in a SOI substrate. In some embodiments, at least some of the plurality of structures contact the insulating layer in a SOI substrate and at least some of the plurality of structures extend from the back side of the SOI substrate into the SOI substrate.

Another article of manufacture is an integrated circuit die with a plurality of transistors formed on the front side of a substrate. A plurality of structures within the substrate contain a solid heat conductive media with a thermal conductivity greater than the thermal conductivity of the substrate without the heat conductive media. In some embodiments, the heat conductive media comprises carbon nanotubes and/or copper. The carbon nanotubes and/or copper are configured to transfer heat produced by the plurality of transistors to the back side of the substrate.

Another article of manufacture is an integrated circuit die coupled to a heat sink. The integrated circuit die has a plurality of transistors formed on the front side of a substrate. A plurality of structures within the substrate contain a solid heat conductive media with a thermal conductivity greater than the thermal conductivity of the substrate without the heat conductive media. In some embodiments, the heat conductive media comprises carbon nanotubes and/or copper.

FIGS. 9a-9h are schematic cross sections illustrating a method of forming a plurality of structures within a substrate that contain a solid heat conductive media in accordance with one embodiment of the present invention. The method shown in FIG. 9a-9h is for making filled cavities extending from the back side of the substrate into the substrate. However, as explained below, analogous steps can also be used to form such structures at other places in a substrate.

Figure 9A:
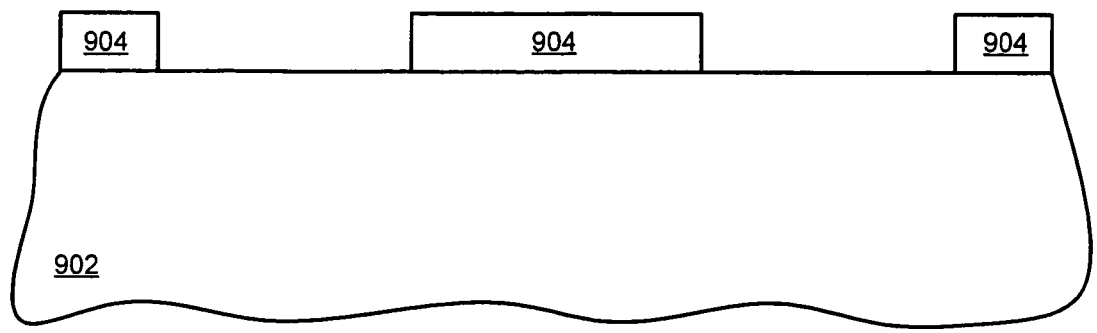
FIGS. 9a-9h are schematic cross sections illustrating a method of forming a plurality of structures within a substrate that contain a solid heat conductive media in accordance with one embodiment of the present invention.

A photoresist layer 904 is deposited on substrate 902 and patterned (FIG. 9a).

Figure 9B:
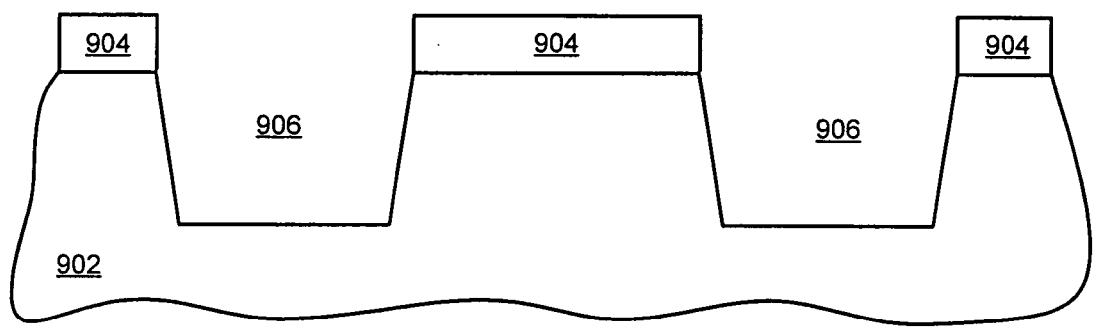

A plurality of cavities 906 are etched into substrate 902 (FIG. 9b). Either a wet etch (e.g., KOH) or a dry etch can be used to form cavities 906. A wide variety of cavity shapes, sizes, and densities can be formed. For example, for a 600-micron-thick silicon substrate, an array of 300 micron by 300 micron square cavities can be formed, with a depth of 300 microns and a separation distance between adjacent cavities of 300-500 microns. This corresponds to a cavity density of about one cavity per 0.36-0.64 $mm^2$ of substrate (i.e., greater than 1 cavity per $mm^2$ or about 160-280 cavities per 100 $mm^2$ of die). Typical die sizes range from 112 $mm^2$ (e.g., for a Pentium 4 with 0.09 micron track widths) to 193 $mm^2$ (e.g., for an Athlon 64 with 0.13 micron track widths), which corresponds to substantially more than 100 cavities per die. A preferred cavity geometry and density will permit as much high thermal conductivity media (e.g., carbon nanotubes and/or copper) as possible to be incorporated into the lower thermal conductivity substrate, while still maintaining acceptable mechanical properties and smoothness for the substrate.

Figure 9C:
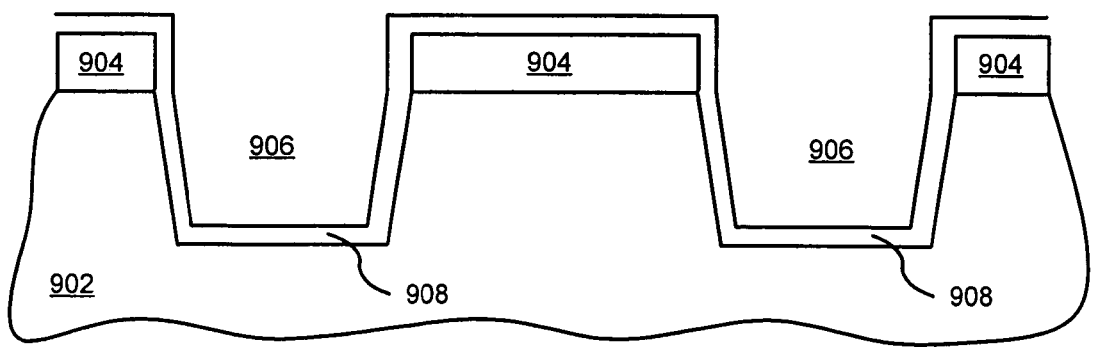
Figure 9D:
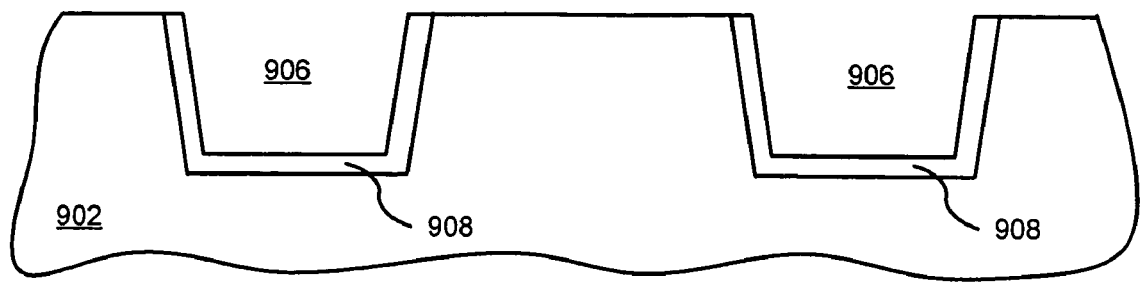

If carbon nanotubes are going to be grown in the cavities 906, one or more metal layers 908 are deposited prior to nanotube growth (FIG. 9c).

In some embodiments, layer 908 comprises 30-50 nm of an adhesion layer (e.g., Ti or Cr) and 6-30 nm of a catalyst layer (e.g., as noted above, Ni, Co, Fe, alloys thereof, or silicides thereof). In some embodiments, 10-30 nm of Al is deposited between the adhesion layer and the catalyst layer.

In embodiments where copper will be electrodeposited to fill the space between the carbon nanotubes, layer 908 may comprise an adhesion layer, a copper diffusion barrier layer (e.g., TaN), a copper seed layer, a barrier layer (e.g., Ti), and a catalyst layer.

The metal layers 908 can be formed by sputtering, evaporation, or other deposition techniques that are well known to those of ordinary skill in the art.

Figure 9E:
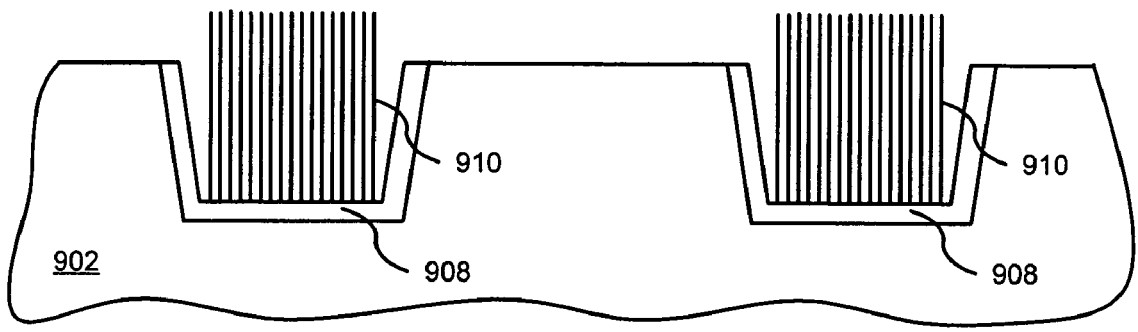

Photoresist 904 is removed (FIG. 9d) and carbon nanotubes 910 are grown on metal layers 908 in cavities 906 (FIG. 9e). As noted above, a number of deposition techniques for growing carbon nanotubes are known to those of ordinary skill in the art. In some embodiments, the nanotubes 910 are grown using PECVD, typically between 600-850° C. with an electric field to align the tubes. In some embodiments, a thermal anneal is performed after growth of the carbon nanotubes to release thermal stresses and to remove defects in the nanotube layer. Thermal annealing is typically done at temperatures ranging from 700° C. to 1000° C.

Figure 9F:
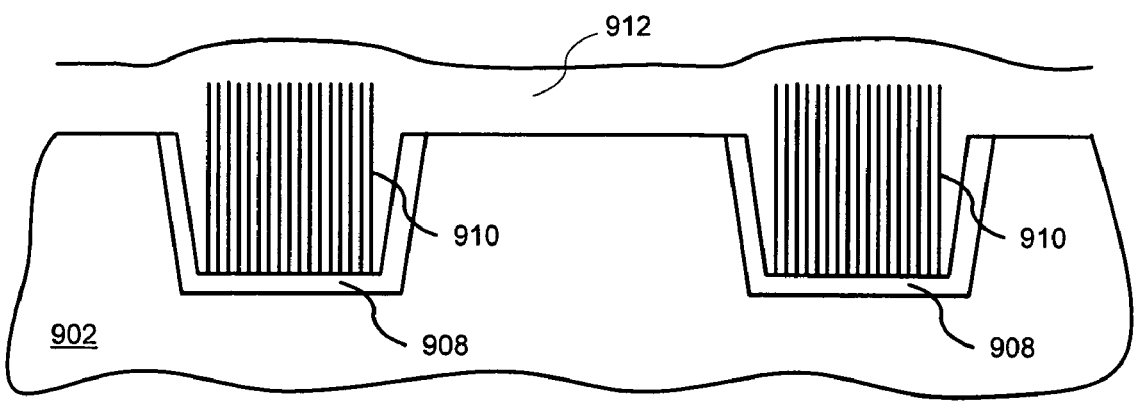

A layer 912 is deposited on the nanotubes 910 and the substrate 902 (FIG. 9f). In some embodiments, layer 912 is a protective layer such as TEOS $SiO_2$ (i.e., $SiO_2$ grown from tetraethoxysilane). Layer 912 can protect the nanotubes 910 during the subsequent processing, if any, that needs to be done on the front side of the substrate (e.g., forming transistors) that would otherwise damage the nanotubes. After such processing is completed, back side processing (e.g., see FIG. 9g-9h) can continue.

In other embodiments, layer 912 is a metal such as copper, aluminum, or tungsten. As noted above, filling voids between nanotubes with another high thermal conductivity material helps remove heat from the substrate.

Figure 9G:
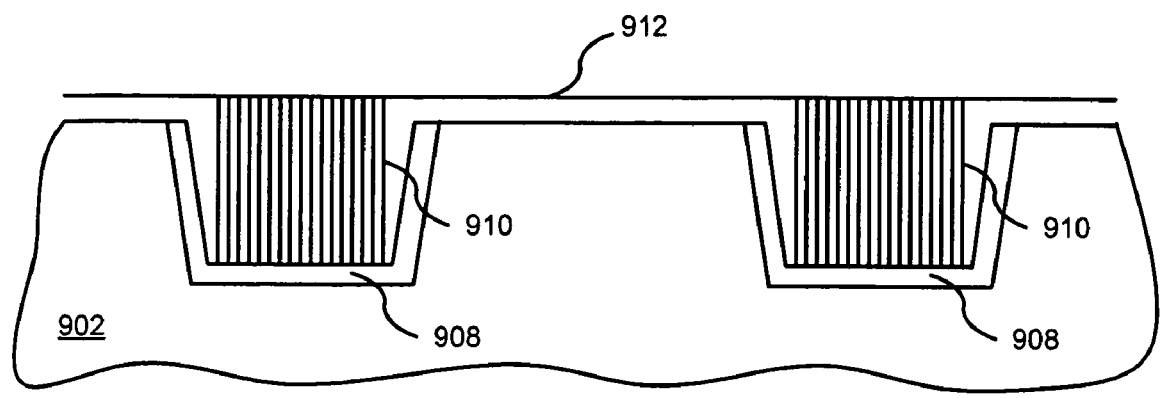

Layer 912 and nanotubes 910 are planarized (FIG. 9g). Chemical and/or mechanical polishing can be used to perform the planarization. In some embodiments, the thickness of layer 912 after planarization is about 30 microns.

Figure 9H:
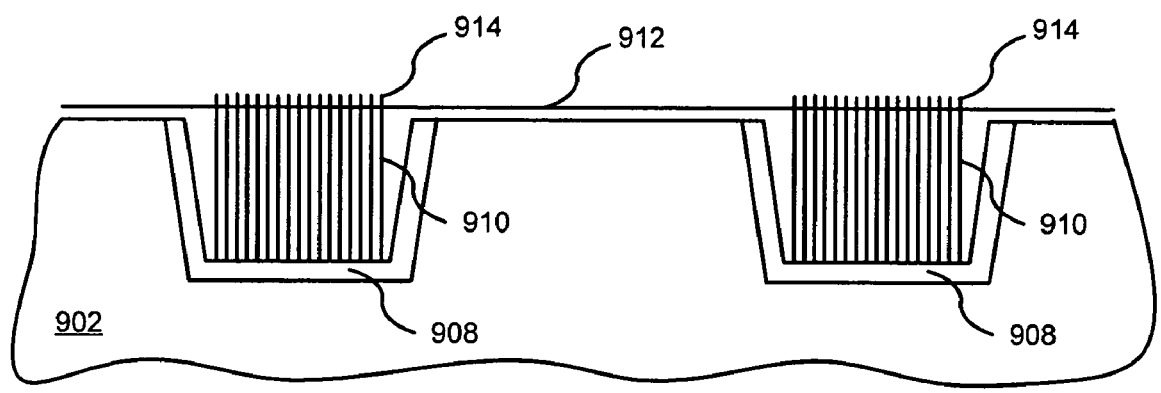

Layer 912 is etched back, thereby exposing the tips 914 of the carbon nanotubes 910 (FIG. 9h). In some embodiments, the exposed tips 914 are about 10-15 microns in length. For carbon nanotubes with diameters of about 50-120 nm, conventional die attach pressures (e.g., 30-70 psi) are sufficient to make good thermal contact between 10-15 micron-long tips 914 on substrate 902 and an adjacent heat sink.

In some embodiments, the cavities 906 are filled with copper, without any carbon nanotubes. For these embodiments, layer 908 may comprise an adhesion layer, a copper diffusion barrier layer (e.g., TaN), and a copper seed layer. Copper can then fill cavities 906, e.g., by electrochemical deposition. Chemical and/or mechanical polishing can then be used to planarize the back surface of the substrate 902.

Figure 10:
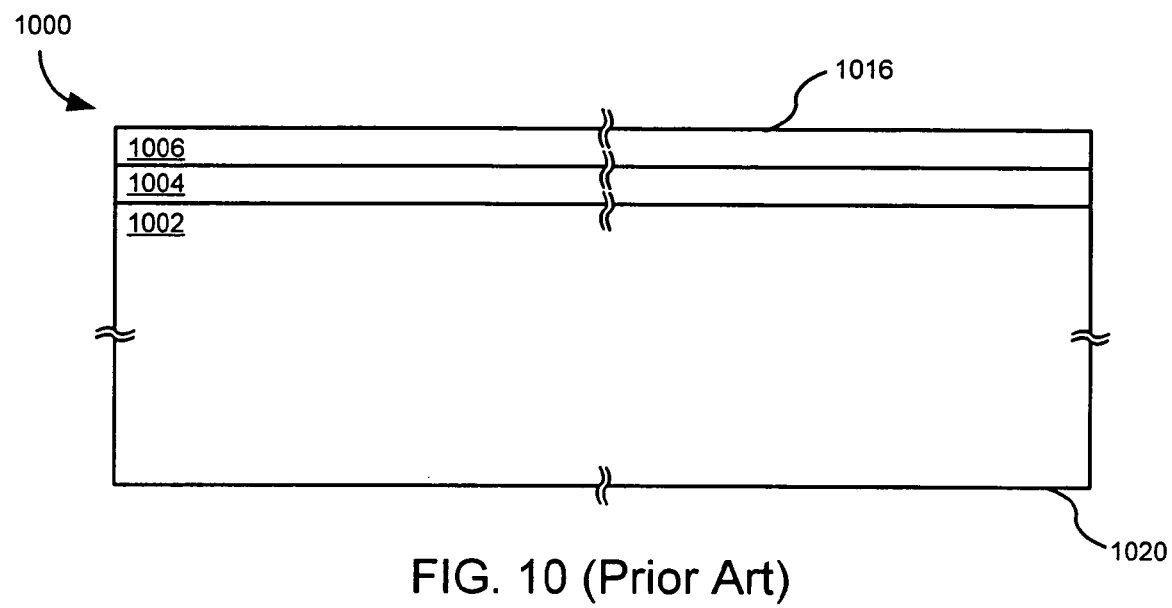
FIG. 10 is a schematic cross section of a conventional, prior art SOI substrate.

FIG. 10 is a schematic cross section of a conventional, prior art SOI substrate 1000. In a conventional SOI substrate 1000, a thin layer of silicon 1006 contacts a thin layer of insulator 1004, which in turn contacts the base substrate 1002 (e.g., Si), which provides mechanical support. Methods of making conventional SOI substrates 1000 are known in the art. For example, U.S. Pat. No. 6,372,609, which is incorporated by reference herein in its entirety, describes a method of fabricating an SOI wafer by hydrogen ion delamination. In this method, a first silicon wafer is oxidized to form an insulating layer of $SiO_2$ (which will become layer 1004). The $SiO_2$ is typically 0.1-2.0 microns thick. Hydrogen ions are implanted through the insulating layer into the silicon, thereby forming a fine bubble layer in the first silicon wafer at the mean penetration depth of the hydrogen ions. The insulating layer of $SiO_2$ 1004 is bonded to a second silicon wafer (which will become layer 1002). The insulating layer 1004 and a thin layer of silicon (i.e., the silicon in the first wafer at less than the mean penetration depth of the hydrogen ions, which will become layer 1006) are delaminated from the first wafer. The delamination occurs at the fine bubble layer in the first silicon wafer. As described in U.S. Pat. No. 6,372,609, additional processing is then done to improve the quality of the thin silicon layer 1006 so that the front side 1016 of the SOI substrate 1000 is capable of having formed thereon integrated circuits with a plurality of transistors.

Figure 11:
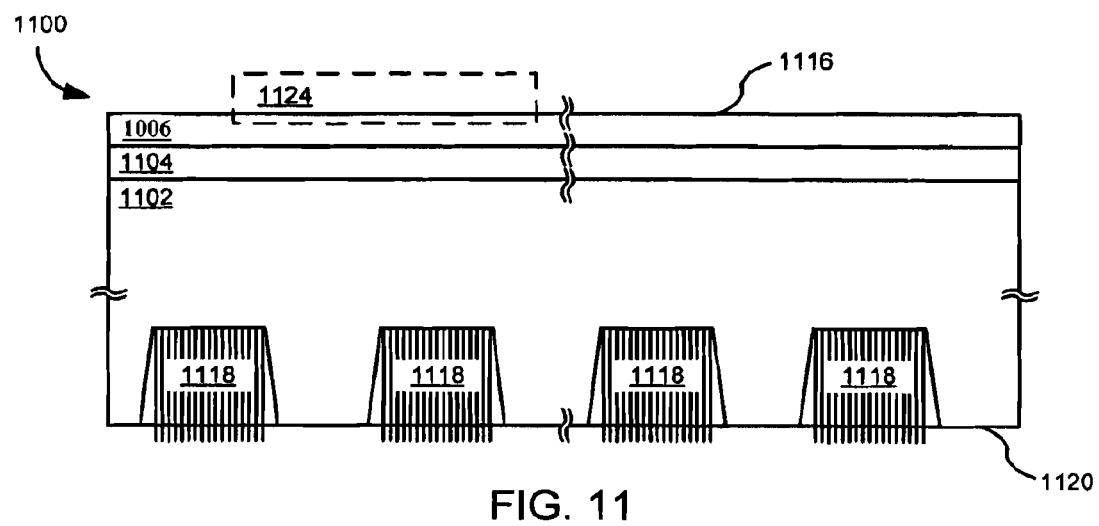
FIG. 11 is a schematic cross section of an SOI substrate in which a plurality of structures on the back side of the SOI substrate extend into the substrate in accordance with one embodiment of the present invention.
Figure 12:
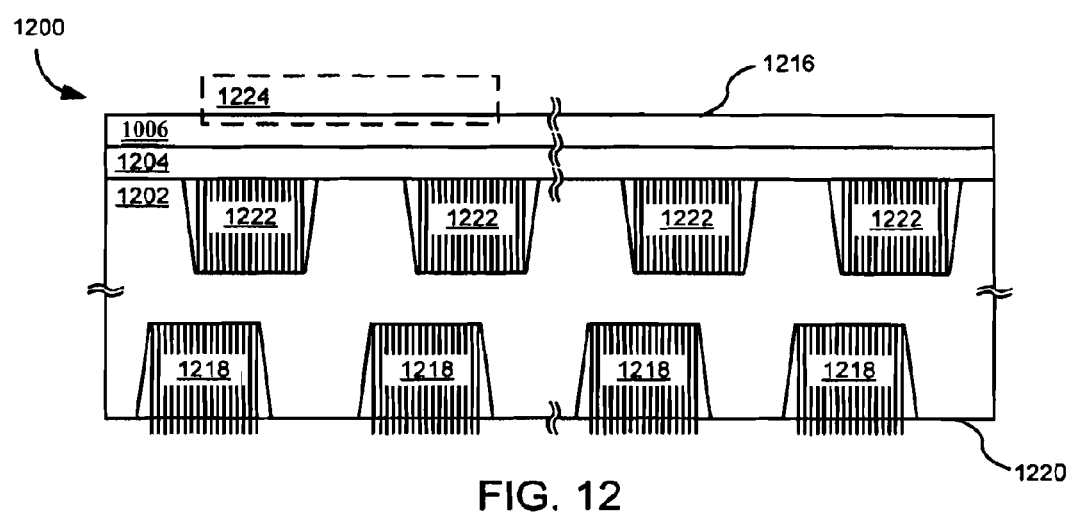
FIG. 12 is a schematic cross section of an SOI substrate in which a plurality of structures on the back side of the SOI substrate extend into the substrate and a plurality of structures contact the insulating layer in the SOI substrate, but do not extend into the insulating layer, in accordance with one embodiment of the present invention.
Figure 13:
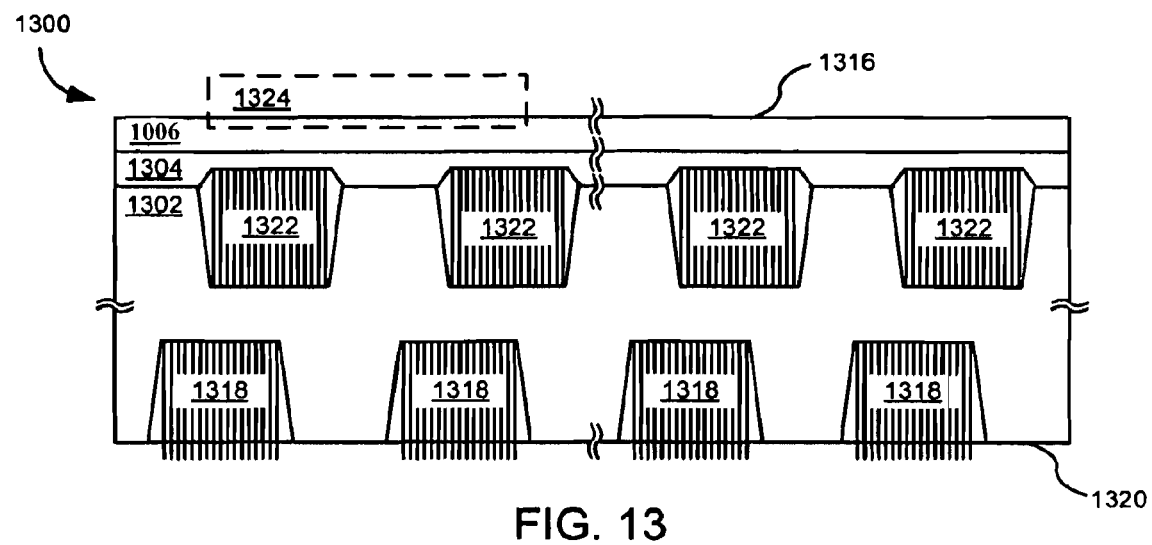
FIG. 13 is a schematic cross section of an SOI substrate in which a plurality of structures on the back side of the SOI substrate extend into the substrate and a plurality of structures contact the insulating layer in the SOI substrate and extend into the insulating layer in accordance with one embodiment of the present invention.

FIGS. 11-13 are schematic cross sections illustrating SOI substrates 1100, 1200, and 1300, respectively, with a plurality of structures within each substrate that contain a solid heat conductive media in accordance with three embodiments of the present invention.

FIG. 11 is a schematic cross section of an SOI substrate 1100 in which a plurality of structures (e.g., filled cavities 1118) on the back side 1120 of the SOI substrate 1100 extend into the substrate in accordance with one embodiment of the present invention. Substrate 1100 can be formed using the method shown in FIGS. 9a-9h and described above. Well-known techniques can then be used to process substrate 1100 into a plurality of integrated circuit die with a plurality of transistors 1124 formed and located on the front side 1116 of the substrate 1100. In turn, well-known techniques can then be used to couple the integrated circuit die to a heat sink.

FIG. 12 is a schematic cross section of an SOI substrate 1200 in which a plurality of structures (e.g., filled cavities 1218) on the back side 1220 of the SOI substrate 1200 extend into the substrate and a plurality of structures (e.g., filled cavities 1222) contact the insulating layer 1204 in the SOI substrate 1200, but do not extend into the insulating layer 1204, in accordance with one embodiment of the present invention. A plurality of filled cavities 1218 on the back side 1220 extending into the substrate 1200 can be formed using the method shown in FIGS. 9a-9h and described above. A plurality of filled cavities 1222 contacting the insulating layer 1204, but not extending into the insulating layer 1204, can be formed using the method shown in FIGS. 9a-9g and described above, with minor modifications.

In particular, layer 912 is planarized to a thickness of 1 micron or less or removed altogether (FIG. 9g) and there is no etch back to expose the nanotube tips 914 (FIG. 9h) for filled cavities 1222. Layer 1202 (including the planarized filled cavities 1222) is then bonded to insulating layer 1204 and the remainder of the hydrogen ion delamination process (e.g., as described in U.S. Pat. No. 6,372,609) is completed.

Well-known techniques can then be used to process substrate 1200 into a plurality of integrated circuit die with a plurality of transistors 1224 formed and located on the front side 1216 of the substrate 1200. In turn, well-known techniques can then be used to couple the integrated circuit die to a heat sink.

Figure 14A:
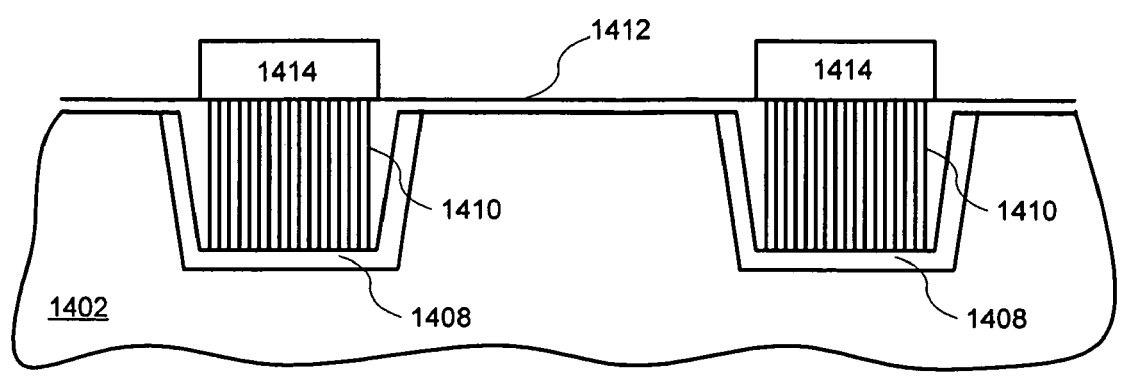
FIGS. 14a-14b are schematic cross sections illustrating a method of making a plurality of structures that contain a solid heat conductive media that can extend into the insulating layer in a SOI substrate in accordance with one embodiment of the present invention.
Figure 14B:
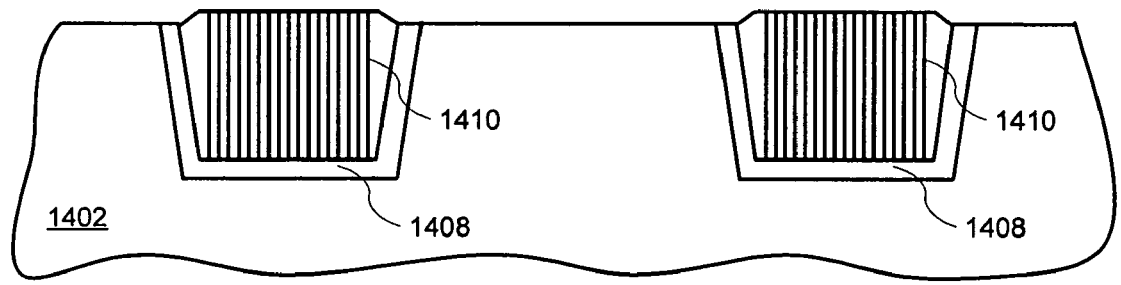

FIG. 13 is a schematic cross section of an SOI substrate 1300 in which a plurality of structures (e.g., filled cavities 1318) on the back side 1320 of the SOI substrate 1300 extend into the substrate and a plurality of structures (e.g., filled cavities 1322) contact the insulating layer 1304 in the SOI substrate 1300 and extend into the insulating layer 1304 in accordance with one embodiment of the present invention. A plurality of filled cavities 1318 on the back side 1320 extending into the substrate 1300 can be formed using the method shown in FIGS. 9a-9h and described above. A plurality of filled cavities 1322 contacting and extending into the insulating layer 1304 can be formed using the method shown in FIGS. 9a-9g and described above, with the modifications described below and in FIGS. 14a-14b. FIGS. 14a-14b are schematic cross sections illustrating a method of making a plurality of structures that contain a solid heat conductive media that can extend into the insulating layer 1304 in a SOI substrate 1300 in accordance with one embodiment of the present invention. FIGS. 14a-14b use carbon nanotubes as an exemplary heat conductive media, but other media (e.g., copper) could also be used.

In particular, layer 912 is planarized to a thickness of about 1 micron (FIG. 9g). There is no etch back to expose the nanotube tips 914 (FIG. 9h) for filled cavities 1322. Instead, photoresist 1414 is deposited and patterned (FIG. 14a). Layer 1412 is etched off (except where it is covered by photoresist 1414) and then the photoresist 1414 is removed (FIG. 14b). This process creates a plurality of micron-size "bumps" on the surface of layer 1302 at the structures of filled cavities 1322. Photoresist deposition, patterning, etching, and removal is used to create a corresponding set of micron-size "depressions" in insulating layer 1304. Layer 1302 (which corresponds to layer 1402 in FIG. 14b) is then bonded to insulating layer 1304 and the remainder of the hydrogen ion delamination process (e.g., as described in U.S. Pat. No. 6,372,609) is completed.

Well-known techniques can then be used to process substrate 1300 into a plurality of integrated circuit die with a plurality of transistors 1324 formed and located on the front side 1316 of the substrate 1300. In turn, well-known techniques can then be used to couple the integrated circuit die to a heat sink.

The structure illustrated in FIG. 12 creates a greater fraction of high thermal conductivity material in the SOI substrate than the structure illustrated in FIG. 11, but is more complicated to make. In turn, the structure illustrated in FIG. 13 reduces the thermal resistance of insulating layer 1304 more than the structure illustrated in FIG. 12, but is more complicated to make than the structure illustrated in FIG. 12.

For integrated circuits using substrates such as 1100, 1200, or 1300, a plurality of transistors (e.g., 1124, 1224, or 1324) formed and located on the front side of the substrate will generate heat. At least some of the heat will be conducted to the back side of the substrate via a plurality of structures within the substrate that contain a solid heat conductive media comprising carbon nanotubes and/or copper. For clarity, and as is well known in the art, the plurality of transistors that are formed and located "on" the front side of the substrate will have portions of the transistors that are located "in" the substrate (e.g., the source and drain diffusions).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An article of manufacture, comprising:
   a substrate with a front side and a back side, wherein the front side of the substrate is capable of having formed thereon a plurality of transistors, wherein the substrate is a silicon-on-insulator (SOI) substrate, with a silicon layer on top of an insulating layer on top of a base substrate; and
   a plurality of filled cavities within the substrate that contain a solid heat conductive media comprising carbon nanotubes, wherein the plurality of filled cavities have a density of greater than 1 cavity per mm$^2$ and a first subset of the plurality of filled cavities extend from the back side of the substrate into the substrate, and wherein a second subset of the plurality of filled cavities other than the first subset contact the insulating layer in the silicon-on-insulator (SOI) substrate.

2. An article of manufacture, comprising:
   a substrate with a front side and a back side, wherein the front side of the substrate is capable of having formed thereon a plurality of transistors, wherein the substrate is a silicon-on-insulator (501) substrate with a silicon layer on top of an insulating layer on top of a base substrate; and
   a plurality of structures within the substrate that contain a solid heat conductive media comprising carbon nanotubes, wherein a first subset of the plurality of structures extend from the back side of the substrate into the substrate, wherein a second subset of the plurality of structures other than the first subset contact the insulating layer in the silicon-on-insulator (SOI) substrate.

3. The article of manufacture of claim 2, wherein the carbon nanotubes are formed within the substrate using a catalyst.

4. The article of manufacture of claim 2, wherein the structures have a density of greater than 1 per mm$^2$.

5. The article of manufacture of claim 2, wherein the structures comprise filled cavities.

6. The article of manufacture of claim 2, wherein the base substrate is a silicon substrate.

7. The article of manufacture of claim 2, wherein at least some of the plurality of structures extend into the insulating layer of the SOI substrate.

8. The article of manufacture of claim 2, wherein
   the article of manufacture comprises an integrated circuit die; and
   a plurality of transistors are formed on the front side of the substrate.

9. The article of manufacture of claim 8, wherein the carbon nanotubes are formed within the substrate using a catalyst.

10. The article of manufacture of claim 8, wherein the structures have a density of greater than 1 per mm$^2$.

11. The article of manufacture of claim 8, wherein the carbon nanotubes are configured to transfer heat produced by the plurality of transistors to the back side of the substrate.

12. An article of manufacture, comprising:
    a heat sink and
    an integrated circuit die coupled to the heat sink that includes:
    a substrate with a front side and a back side, wherein a plurality of transistors are formed on the front side, wherein the substrate is a silicon-on-insulator (SOI) substrate, with a silicon layer on top of an insulating layer on top of a base substrate; and
    a plurality of structures within the substrate that contain a solid heat conductive media comprising carbon nanotubes, wherein a first subset of the plurality of structures extend from the back side of the substrate into the substrate, wherein a second subset of the plurality of structures other than the first subset contact the insulating layer in the silicon-on-insulator (SOI) substrate.

13. The method of claim 12, wherein at least some of the plurality of structures extend into the insulating layer of the SOI substrate.

14. A method, comprising:
    in a substrate with a front side and a back side, wherein the front side of the substrate is capable of having formed thereon a plurality of transistors, wherein the substrate is a silicon-on-insulator (501) substrate, with a silicon layer on top of an insulating layer on top of a base substrate; and
    forming a plurality of structures within the substrate that contain a solid heat conductive media comprising carbon nanotubes, wherein a first subset of the plurality of structures extend from the back side of the substrate into the substrate, wherein a second subset of the plurality of structures other than the first subset contact the insulating layer in the silicon-on-insulator (SOI) substrate.

15. The method of claim 14, wherein at least some of the plurality of structures extend into the insulating layer of the SOI substrate.

16. A method, comprising:
    in a substrate with a front side and a back side, wherein the substrate is a silicon-on-insulator (SOI) substrate, with a silicon layer on top of an insulating layer on top of a base substrate,
    generating heat with a plurality of transistors formed on the front side of the substrate; and
    conducting at least some of the heat to the back side of the substrate via a plurality of structures within the substrate that contain a solid heat conductive media comprising carbon nanotubes, wherein a first subset of the plurality of structures extend from the back side of the substrate into the substrate, wherein a second subset of the plurality of structures other than the first subset contact the insulating layer in the silicon-on-insulator (SOI) substrate.

17. The method of claim 16, wherein at least some of the plurality of structures extend into the insulating layer of the SOI substrate.

* * * * *

UNITED STATES PATENT AND TRADEMARK OFFICE
CERTIFICATE OF CORRECTION

| | |
|---|---|
| PATENT NO. | : 7,656,027 B2 |
| APPLICATION NO. | : 11/443669 |
| DATED | : February 2, 2010 |
| INVENTOR(S) | : Carlos Dangelo et al. |

It is certified that error appears in the above-identified patent and that said Letters Patent is hereby corrected as shown below:

In column 13, line 41, delete "501" and insert -- SOI --.

In column 14, line 32, delete "501" and insert -- SOI --.

Signed and Sealed this

Twenty-third Day of March, 2010

David J. Kappos
*Director of the United States Patent and Trademark Office*